United States Patent [19]

Meineke

[11] Patent Number: 4,718,632
[45] Date of Patent: Jan. 12, 1988

[54] HOLD-DOWN TYPE MECHANISM

[75] Inventor: William S. Meineke, Lomita, Calif.

[73] Assignee: Rexnord Inc., Brookfield, Wis.

[21] Appl. No.: 896,903

[22] Filed: Aug. 14, 1986

[51] Int. Cl.⁴ .............................................. F16M 3/00
[52] U.S. Cl. ..................................... 248/681; 248/500
[58] Field of Search ............... 248/681, 680, 672, 500, 248/506; 24/590, 457

[56] References Cited

U.S. PATENT DOCUMENTS

| 1,758,646 | 5/1930 | Brown | 248/681 |
| 2,376,280 | 5/1945 | Schonert et al. | |
| 2,745,303 | 5/1956 | Cornelius | |
| 3,128,979 | 4/1964 | Damelio | 248/680 |
| 3,275,276 | 9/1966 | Johnson | 248/500 |
| 3,429,534 | 2/1969 | Bean et al. | 248/500 |
| 3,473,765 | 10/1969 | Matson | 248/672 |
| 3,640,141 | 2/1972 | Hollingsead et al. | |
| 3,796,985 | 3/1974 | Weber | |
| 3,866,878 | 2/1975 | Yamamoto | 248/500 |
| 4,534,234 | 8/1985 | Cosenza | |

FOREIGN PATENT DOCUMENTS 0024924 of 1907 United Kingdom ............... 248/681

Primary Examiner—Ramon O. Ramirez

[57] ABSTRACT

A mechanism of the hold-down type is provided which permits a predetermined load to be applied to a unit, e.g. an avionics box, secured upon a structure, while also permitting insertion and extraction of that unit through operation of the mechanism. The mechanism is particularly adapted for use in relatively confined areas. It includes a hook (70) which is mounted to the unit itself, and a housing (20) which is constructed for releaseable engagement with the hook (70) and which houses the clutching mechanism components (28, 30, 38, 42, 43, 45). A drive shaft portion (31) extends from one end only of the housing (20) and is retained by a hinge-type mounting which includes a bracket member (50) secured to the structure supporting the unit, and a nut element (51). The nut element (51) and bracket member (50) are constructed so as to limit both the downward and upward pivotal movement of the housing (20) and the drive shaft (30).

9 Claims, 14 Drawing Figures

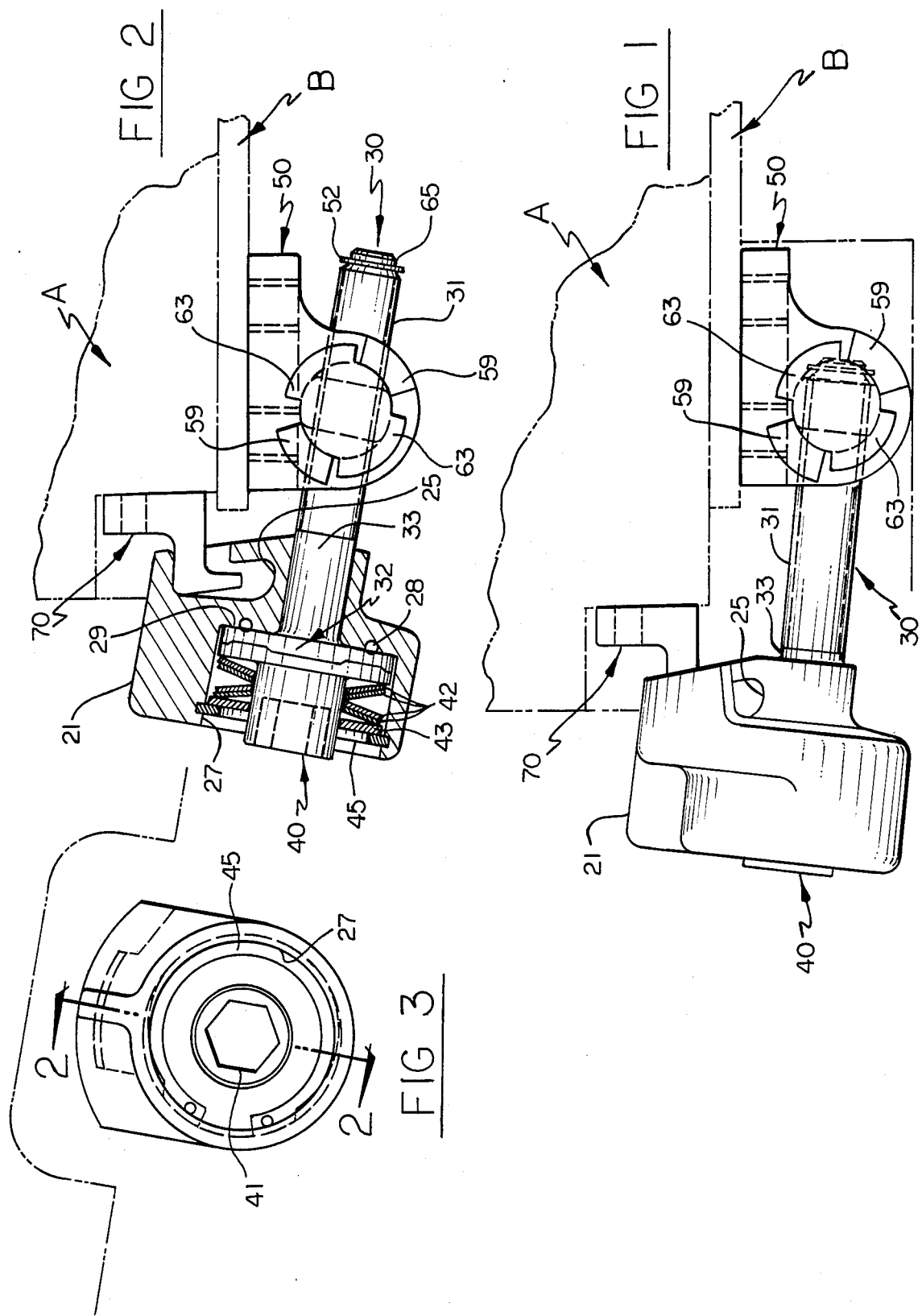

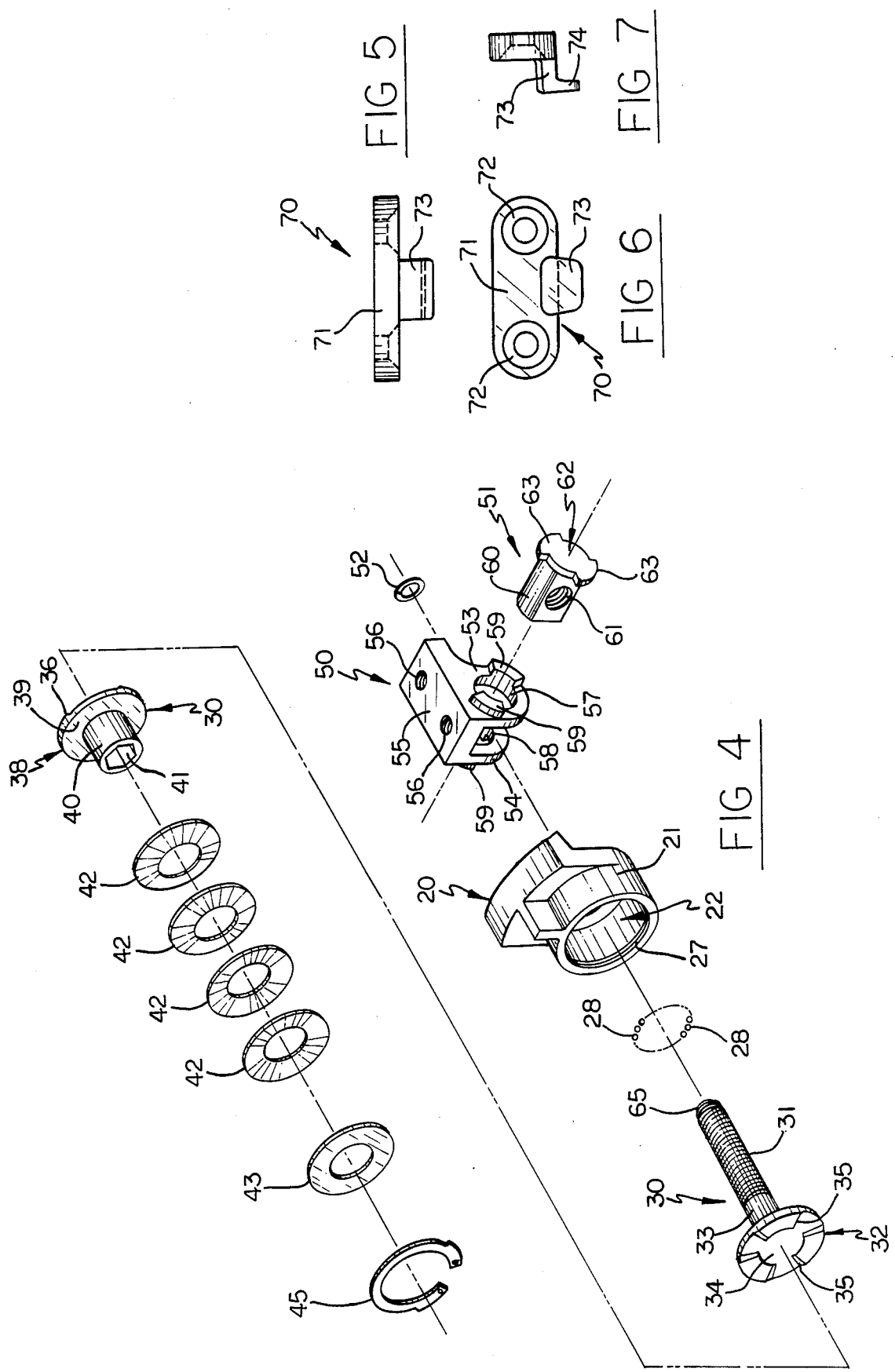

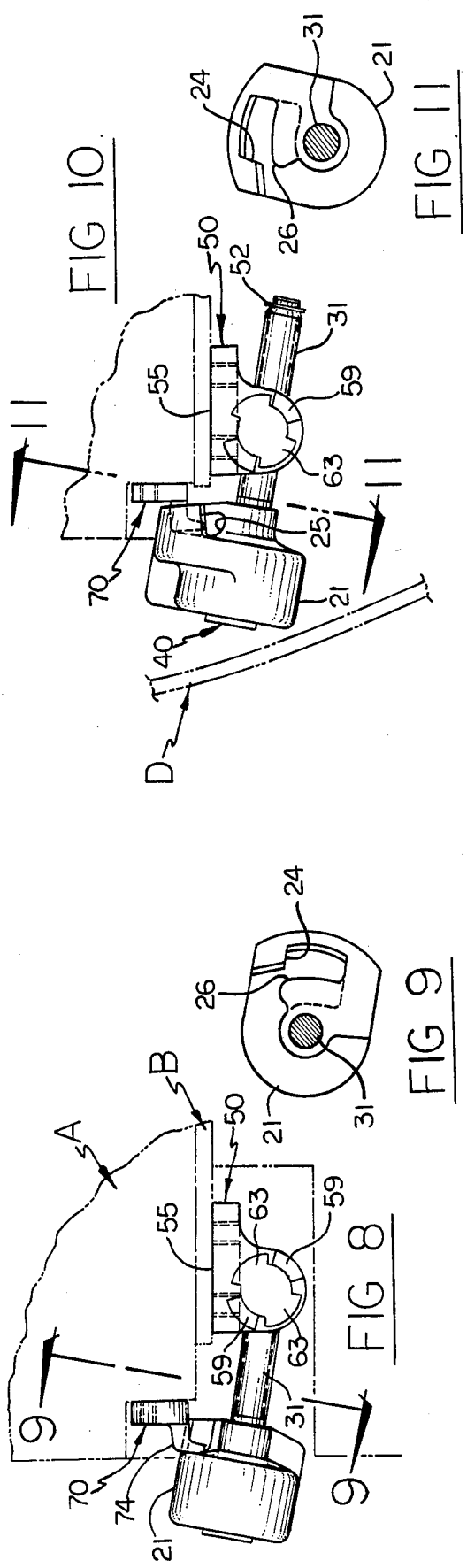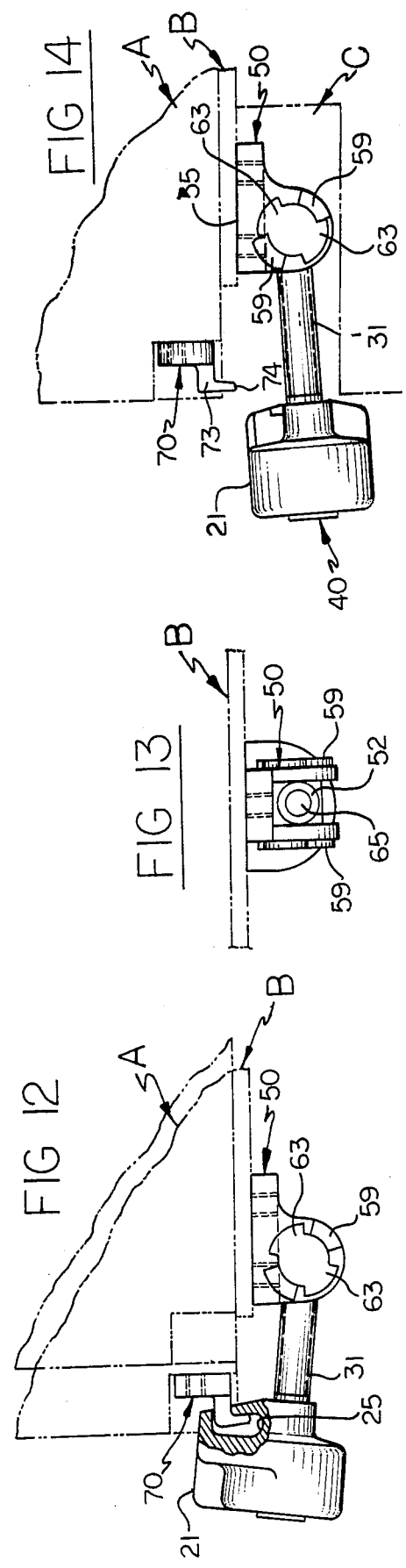

4,718,632

HOLD-DOWN TYPE MECHANISM

TECHNICAL FIELD

The present invention relates to mechanisms of the hold-down type typically used to secure avionics boxes within a structure, and in particular the present invention relates to such mechanisms which can be used for insertion and extraction of the boxes within confined spaces.

BACKGROUND

With the advanced technology developed for aircraft, ground support equipment, and ships has come the need for mechanisms which match such technology in both size and performance requirements. The new aircraft employ the latest technology in miniaturized circuitry, components and accessories. Likewise, the devices which hold such items in place on the aircraft under a pre-determined load in order to insure prior orientation and operation, must also be miniaturized from that which is presently available in the known prior art for hold-down type devices. Merely reducing the size of the components of the known devices is not sufficient to meet the new requirements. Structural modifications affecting the entire device are necessary and have led to the development of the present invention.

SUMMARY

The present invention is a mechanism of the hold-down type which is constructed for use in relatively confined areas. The invention provides the known functions of insertion, extraction and hold-down forces for a unit, e.g. an avionics box within an aircraft, however it does so with a structural arrangement thus far unknown in the prior art.

The present invention includes a unique housing and hook which cooperate throughout the operation of the mechanism. The drive shaft of the mechanism is uniquely restrained from extending completely through the housing as it moves axially in opposite directions for the application of insertion and extraction forces. Further, the manner by which the drive shaft and housing are secured to the structure supporting the unit is unique in that the mechanism is restrained in its pivotal movement upward relative to the structure and unit, and in its pivotal movement downward relative to a like unit situated closely adjacent thereto.

The invention represents a new generation in the state of the art for hold-down type mechanisms because of its unique structure which permits its use in confined areas. The particular structure of a preferred embodiment and the benefits of the present inventions will be discussed in detail in the description which follows.

BRIEF DESCRIPTION OF THE DRAWINGS

FIG. 1 is a side elevational view of a preferred embodiment of the present invention as shown secured to and ready for operation relative to a unit and its underlying structure.

FIG. 2 is a view in cross-section taken generally along lines 2—2 in FIG. 3 subsequent to the operation of the mechanism.

FIG. 3 is an end view of FIG. 2.

FIG. 4 is a view in perspective of the various components of the preferred embodiment shown in exploded orientation to illustrate the assembly of the embodiment.

FIG. 5 is a top plan view of the hook of the preferred embodiment.

FIG. 6 is a front plan view of the hook of the preferred embodiment.

FIG. 7 is a side plan view of the hook shown in FIGS. 5 and 6.

FIG. 8 is a side elevational view of the preferred embodiment as it would appear prior to securement of the housing with the hook.

FIG. 9 is a plan view of the housing in FIG. 8 as seen generally along lines 9—9 in FIG. 8.

FIG. 10 is a side elevational view of the preferred embodiment as it would appear during the application of predetermined hold-down forces upon the unit secured thereby.

FIG. 11 is a plan view of the housing in FIG. 10 as seen generally along lines 11—11 in FIG. 10.

FIG. 12 is a side elevational view of the preferred embodiment as it would appear during the extraction mode of the operation of the invention.

FIG. 13 is an end view of the preferred embodiment seen in FIG. 12.

FIG. 14 is a side elevational view of the preferred embodiment as it would appear when the housing is released from the hook, yet secured to the structure which supports the unit.

DESCRIPTION OF A PREFERRED EMBODIMENT

A preferred embodiment of the present invention will be described with reference to FIGS. 1-14. Like reference numerals are used throughout the several views to refer to the same element.

FIGS. 1-3 show the preferred embodiment in an assembled condition relative to a unit A it will secure under a predetermined load upon an underlying or supporting structure B. The embodiment is operated by the use of a hex-type tool commonly used in the aircraft industry. The basic purpose for the invention is well understood by those skilled in the hold-down mechanism art, i.e. to provide hold-down, insertion and extraction forces to a unit, e.g. an avionics box, which must operate successfully in extremely demanding circumstances which include severe vibrational loads. It is the particular structure of the preferred embodiment which will be discussed in detail. A unique structural arrangement of the components of the mechanism permit the use of the mechanism in confined areas which cannot be served by known hold-down devices.

Turning now to FIGS. 4–7, the structure of the preferred embodiment will be explained. In FIG. 4, the exploded assembly of the components is shown. The initial assembly component is the most dominant, and that is the item referred to as the housing 20. It should be appreciated at this point that the housing 20 of the present invention combines both the knob and housing features of the known prior art devices. Hence the use of the word housing in this description is not to be construed as narrowly as used to describe one element of the prior art devices.

The housing 20 is essentially an enclosure for other components of the invention as can be appreciated from the cross-sectional view of FIG. 2. It has an outer wall or surface area 21, and an inner area defined by two distinct through-holes. A first through-hole 22 at the rearward end of the housing typically has a greater diameter than that of the second through-hole which extends continous to the first-hole through to the opposite or forward end of the housing 20. Turning back again to FIG. 4, an initial portion 27 of the larger through-hole 22 is grooved to receive a retaining ring. Along the outer wall 21 of the housing there is formed a unique detent 24 and recessed area or cavity 25 at the forward end of the housing (See FIG. 9). The detent 24 in combination with the recessed area 25 define a passageway 26. All three elements 24, 25, 26 are configured so as to accommodate a portion of a hook, to be described hereinafter. It should be noted that the detent, recessed area, and passageway shown for the preferred embodiment are particular to this embodiment and follow the orientation of the selected hook. If the invention was required to operate in an orientation of that shown for the preferred embodiment, the hook by necessity would be oriented differently and hence the housing detent and recessed area would be modified to follow the orientation of the hook. Thus, to one skilled in the art, the modifications (which would be obvious from the teachings of the invention as shown through the preferred embodiment) required for different mounting orientations need not be explained at length.

Within the housing through-holes the following components are assembled. A plurality of ball bearings 28 are positioned for movement within an annular track at the portion of the through-hole 22 most adjacent the second through-hole area. The ball bearings 28 serve to separate the housing inner wall from the surface 29 of the drive shaft 30. The drive shaft 30 is inserted into the housing 20 from the first through-hole 22 and rest upon the ball bearing 28 and extends beyond the housing 20 through the opening created by the second through-hole of the housing. As can be appreciated from FIGS. 2 and 4, the drive shaft 30 has a threaded shaft portion 31 and a clutch plate end 32 which are connected therebetween by a relatively smooth shaft portion 33. This smooth shaft portion 33 is situated substantially within the second through-hole of the housing and is designed to rotate freely therein as the drive shaft is rotated clockwise and counterclockwise. The clutch plate portion 32 has a generally disc-shaped appearance. As mentioned earlier, one surface 29 interacts with the ball bearings 28, while a second surface 34 opposite thereto is constructed with a number of notched areas 35 which cooperate with like surfaces 36 on a drive clutch component 38.

The drive clutch component 38 includes a forward portion 39 comparable to that of the clutch plate 32 of the drive shaft 30. The notched areas 36 on one surface of the drive clutch 38 are designed t4o mate in an interfitting manner with those of the clutch plate 32, as is commonly known for providing a clutch mechanism for hold-down devices. Extending rearward from the plate 39 of the drive clutch is a generally cylindrical member 40 having a closed end adjacent the drive clutch plate 39 and free end opposite thereto which is open as defined by a hex-head recessed area 41. The hex-head recessed area 41 is configured so as to accommodate the standard hex-type tools used in the aircraft industry.

Upon the external wall of the drive clutch cylindrical member 40, a number of spring washers 42 are placed. In the preferred embodiment four spring washers 42 are used. The selected number will be determined by the customer's preload requirements. Persons skilled in the art will be able to determine the number of spring washers and particular arrangement of the washers 42 will be necessary to achieve the hold-down forces mandated by the customer without further explanation in this description. Subsequent to the placement of the spring washers 42 upon the drive clutch 38, a flat washer 43 is placed to serve as a type of backing member for confining the spring washers 42 within the housing throughhole 22. To secure the entire assembly within the housing 20, a retaining ring 45 is placed as the last component withinthe housing 20. Together the retaining ring 45, flat washer 43 and drive clutch member 40 close the rearward end of the housing. In the preferred embodiment, the selected retaining ring is the known split, expandable Waldes types retaining ring well known by those skilled in the art. Any number of different retaining rings may be used so long as the basic requirementt is met that the washers 42, 43 be retained within the housing to function as desired in order to achieve a pre-determined preload upon the unit A.

To secure the housing 20 and drive mechanism 30 to a structure B, a mounting arrangement is provided. In the preferred embodiment this mounting arrangement is a hinge type structure which includes a bracket member 50, a nut element 51, and a retaining ring 52. As can be seen in FIG. 4, the bracket member is essentially a three-sided member having two opposing downwardly extending sides 53, 54 and a third, upper wall 55 which serves to connect the two sides 53, 54 with each other. The upper wall 55 is provided with threaded openings 56 through which known fastening devices, such as a screw, are inserted to secure the bracket member to the structure B. In both side walls 53, 54 there are provided and aligned openings 57, 58. Extending outwardly from the bracket member 50 at the periphery of each opening 57, 58, and in opposite relation to each other, are a pair of lugs 59 each of which have angled end walls for reasons to be explained further below.

The nut element 51 is constructed with an elongated body portion 60 through which a threaded throughhole 61 extends transversely, approximately midway along the length thereof. The threaded through-hole 61 is of a size which will threadably engage the threaded shaft portion 31 of the drive shaft. At one end of the elongated body portion 60 a head 62 is provided which includes lug portions 63 situated opposite each other and arranged so as to fit between the lug portions 59 of one side wall of the bracket member 50. The lug portions 63 and 59 on the nut element 52 and bracket member 50 respectively are designed to permit a pre-determined degree of rotational movement of the nut element 51 relative to the fixed position of the mounted bracket member 50. Hence the nut element, housing and drive shaft will rotate together relative to the structure B and the bracket member 50, to the degree permitted by the size and arrangement of the lug portions 59, 63.

To continue with the assembly, the nut element 51 is placed through the openings 57, 58 and thereby captured by the bracket member 50. The drive shaft portion 31 is next threaded into the opening 61 in the nut element 51. The retaining ring 52 is then secured at the free end 65 of the drive shaft 30 to prevent the drive shaft from exiting the nut element 51 during the extraction mode of the operation. To complete the assembly, a hook 70 is mounted to a portion of the unit A, e.g. an avionics box, and the bracket member is secured to the structure B. In the preferred embodiment the hook 70 includes a mounting plate 71 which includes openings 72 through which known fasteners, e.g. rivets, may extend for securing the hook to the unit A. Extending generally at a right angle and outwardly from the mounting plate 71 is a ledge-type portion 73 which terminates in a free end 74. The free end 74 extends in a hook-like manner at an angle typically ninety degrees from the ledge-type portion 73. To further reduce the area in which the mechanism may operate, the unit A may be recessed in the area to which the hook 70 is mounted, as shown in the preferred embodiment. Depending upon the particular mounting orientation requirements of the customer, the free end 74 may extend in a variety of angles relative to the remaining portions of the hook 70. Accordingly, as explained above, one skilled in the art may modify the preferred embodiment as required to meet the customer's requirements without departing from the scope and spirit of the invention's teachings.

With the completed assembly and mounting of the various components of the preferred embodiment, the operation of the mechanism may now be explained and appreciated.

OPERATION OF THE PREFERRED EMBODIMENT

Turning now to FIGS. 8-14 specifically, the mechanism is shown in the various positions it will occupy for insertion, extraction and hold-down of the unit A relative to the structure B and the surrounding environment. The surrounding environment illustrated in phantom lines in FIGS. 10 and 14 may include a door D which lies immediately to the rear of the housing when it is in a closed position, and an adjacent unit C which may be situated directly below the mechanism. It can be appreciated that under such circumstances, the mechanism is required to operate in an extremely confined space while still performing all of the typical functions of a hold-down type device.

In FIG. 8 the mechanism has been lifted up and the housing oriented by rotational movement to the position illustrated in FIG. 9. The position of the housing detent 24 and passageway 26 permit the hook free end 74 to be positioned along the passageway 26 and thus within the recessed area 25 for capture. A hex tool (not shown) is next inserted into the hex recess 41 of the drive clutch 38. In this manner the operator may then rotate the housing clockwise until the recessed area or cavity 25 and detent 24 are oriented relative to the hook free end 74 as shown in FIG. 11. When this is accomplished the housing 20 will be temporarily locked upon the hook 70, with the forces of gravity helping in this regard. Should the hook 70 be mounted such that the housing 20 would not be under the influence of gravity to assist in maintaining it upon the hook 70, the embodiment may be modified to include a biasing means such as a spring (not shown) which will perform the necessary biasing function performed by gravity in the instant case.

After the housing 20 is secured upon the hook, the operator may then apply the desired forces for insertion and hold-down of the device. This is accomplished by continued clockwise rotation of the clutch mechanisms within the housing. Because the free end 74 of the hook 70 is captured within the housing recessed area 25, the unit A must move with the mechanism as it is rotated by the operator. When the predetermined load upon the unit has been achieved as permitted by the selected spring washers 42, the clutching mechanism becomes operative so that further insertion and hold-down forces may not be applied. Such clutching mechanisms are commonly used in the hold-down art to limit the amount of load which may be placed on the unit. The unit A is thus held in place upon the structure B.

Notice should be taken that during the insertion of the unit, the unit A moves forward along the structure B, the drive shaft rotates and moves axially forward beyond the bracket member, and the lugs 63 of the nut element 52 rotate clockwise relative to the lugs 59 on the bracket member. These movements can be appreciated through a comparison of FIGS. 8 and 10.

To unlock the mechanism and permit the extraction of the unit A from the structure B, the operator need merely reverse the procedure for insertion. A hex-head tool (not shown) is again inserted into the hex recess 41 of the drive clutch 38. The operator then rotates the clutch mechanisms counterclockwise. The counterclockwise rotation causes the drive shaft 30 to move rearwardly away from the bracket member 50. Because the drive shaft 30 cannot continue its rearward movement through the housing, separate from the housing, (as do prior art devices), the housing 20 must also move with the drive shaft 30 in a rearward direction. As the housing 20 is pulled rearwardly by the operator's counterclockwise rotation, the capture of the hook free end 74 within the recessed area or cavity 25 of the housing requires that the unit A begin a similar movement rearwardly with respect to the structure B. The rearward, extraction movement of the unit A and of the invention is illustrated by a comparison of the phantom lines with the solid lines for the unit A in FIG. 12. It should be noted that again the lugs 63 of the nut element have rotated relative to the lugs 59 of the bracket member and the drive shaft 30 has moved rearwardly but does not extend beyond the closed end of the housing 20. The abutment of the lugs 59, 63 prevent the unit A from lifting beyond a predetermined angle before it has been sufficiently extracted by the mechanism.

To remove the unit A, without removing the mechanism from the structure B, the operator need merely lift the housing 20 and rotate it counterclockwise to a position as shown in FIG. 9, whereby the hook free end 74 may be released from the recessed area 25. When this is accomplished the housing merely drops downwardly to the extent permitted, as shown in FIG. 14, by the interaction of the lugs 59, 63. In this manner the invention does not interfere with nor damage a like unit or other structure which may lie immediately beneath the bracket member 50.

What is claimed is:

1. A mechanism of the hold-down type which applies a predetermined force to a unit, and insertion and extraction forces thereto for movement relative to a structure upon which the unit is mounted, said mechanism being constructed for use in confined areas and comprising:

a hook adapted for mounting to a portion of the unit;
a housing closed at one end and constructed for releasable engagement with said hook;
drive means for applying a load to the unit, said drive means including a drive shaft extending from one end of said housing opposite said closed end; and
means for pivotably containing said drive shaft in a predetermined orientation relative to the unit, said means including a nut element constructed to engage and permit axial movement of said drive shaft through said nut in a first, forward direction for insertion of the unit, and in a second rearward direction, opposite said first direction, for extraction of the unit relative to the structure.

2. The mechanism of claim 1 wherein said housing includes a second end opposite said closed end, said second end having a first portion through which said drive shaft extends and a second portion, separate from said first portion, constructed for releasable engagement with said hook.

3. The mechanism of claim 2 wherein said housing second end second portion includes a passageway constructed to permit movement of a free end of said hook therethrough, and a recessed area formed integral with said passageway, said recessed area being constructed to capture a portion of said hook when said housing is rotated a predetermined angle relative to said hook.

4. The mechanism of claim 1 wherein said means for pivotably containing said drive shaft further includes a bracket member having a passageway into which said nut element is inserted for capture by said bracket member, said nut element and said bracket member having cooperating structure for limiting the pivotal movement of said drive shaft and said nut element relative to a fixed position of said bracket member.

5. A mechanism of the hold-down type which applies a predetermined force to a unit, and insertion and extraction forces thereto for movement relative to a structure upon which the unit is mounted, said mechanism being constructed for use in confined areas and comprising:
   a hook adapted for mounting to a portion of the unit;
   a housing having a closed first end and a second end opposite said closed end, said second end having a first portion through which said drive shaft extends and a second portion, separate from said first portion, constructed for releasable engagement with said hook;
   drive means for applying a load to the unit, said drive means including a drive shaft extending from one end of said housing opposite said closed end; and
   means for pivotably containing said drive shaft in a predetermined orientation relative to the unit, said means including a nut element constructed to engage and permit axial movement of said drive shaft through said nut in a first, forward direction and in a second rearward direction, a bracket member having a passageway into which said nut element is inserted for capture by said bracket member, said nut element and said bracket member having cooperating structure for limiting the pivotal movement of said drive shaft and said nut element relative to a fixed position of said bracket member.

6. The mechanism of claim 5 wherein said housing second end second portion includes a passageway constructed to permit movement of a free end of said hook therethrough, and a recessed area formed integral with said passageway, said recessed area being constructed to capture a portion of said hook when said housing is rotated a predetermined angle relative to said hook.

7. A mechanism of the hold-down type which applies a predetermined force to a unit, and insertion and extraction forces thereto for movement relative to a structure upon which the unit is mounted, said mechanism being constructed for use in confined areas and comprising:
   a hook adapted for mounting to a portion of the unit;
   a housing having a first closed end and a second end opposite said closed end, said second end having a first portion through which said drive shaft extends and a second portion, separate from said first portion, constructed for releasable engagement with said hook, said second end second portion including a passageway constructed to permit movement of a free end of said hook therethrough, and a recessed area formed integral with said passageway, said recessed area being constructed to capture a portion of said hook when said housing is rotated a predetermined angle relative to said hook;
   drive means for applying a load to the unit, said drive means including a drive shaft extending from one end of said housing opposite said closed end; and
   means for pivotably containing said drive shaft in a predetermined orientation relative to the unit, said means including a nut element constructed to engage and permit axial movement of said drive shaft through said nut in a first, forward direction for insertion of the unit, and in a second rearward direction, opposite said first direction, for extraction of the unit relative to the structure, and a bracket member having a passageway into which said nut element is inserted for capture by said bracket member, said nut element and said bracket member having cooperating structure for limiting the pivotal movement of said drive shaft and said nut element relative to a fixed position of said bracket member.

8. A mechanism of the hold-down type which applies a predetermined force to a unit, and insertion and extraction forces thereto for movement relative to a structure upon which the unit is mounted, said mechanism being constructed for use in confined areas and comprising:
   a hook adapted for mounting to a portion of the unit;
   a housing closed at one end and constructed for releasable engagement with said hook;
   drive means for applying a load to the unit, said drive means including a drive shaft extending from one end of said housing opposite said closed end; and
   means for pivotably containing said drive shaft in a predetermined orientation relative to the unit, said means including a nut element constructed to engage and permit axial movement of said drive shaft through said nut in a first, forward direction for insertion of the unit, and in a second rearward direction, opposite said first direction, for extraction of the unit relative to the structure;
   said housing having a second end opposite said closed end, said second end having a first portion through which said drive shaft extends and a second portion, separate from said first portion, constructed for releasable engagement with said hook;
   said housing further including said second end second portion having a passageway constructed to permit movement of a free end of said hook therethrough, and a recessed area formed integral with said passageway, said recessed area being constructed to capture a portion of said hook when said housing is rotated a predetermined angle relative to said hook.

9. A mechanism of the hold-down type which applies a predetermined force to a unit, and insertion and extraction forces thereto for movement relative to a structure upon which the unit is mounted, said mechanism being constructed for use in confined areas and comprising:
   a hook adapted for mounting to a portion of the unit;

a housing closed at one end and constructed for releasable engagement with said hook;

drive means for applying a load to the unit, said drive means including a drive shaft extending from one end of said housing opposite said closed end; and means for pivotably containing said drive shaft in a predetermined orientation relative to the unit, said means including a nut element constructed to engage and permit axial movement of said drive shaft through said nut in a first, forward direction for insertion of the unit, and in a second rearward direction, opposite said first direction, for extraction of the unit relative to the structure;

said means for pivotably containing said drive shaft further including a bracket member having a passageway into which said nut element is inserted for capture by said bracket member, said nut element and said bracket member having cooperating structure for limiting the pivotal movement of said drive shaft and said nut element relative to a fixed position of said bracket member.

* * * * *